(12) United States Patent
Zhang et al.

(10) Patent No.: US 9,536,880 B2
(45) Date of Patent: Jan. 3, 2017

(54) DEVICES HAVING MULTIPLE THRESHOLD VOLTAGES AND METHOD OF FABRICATING SUCH DEVICES

(71) Applicant: Broadcom Corporation, Irvine, CA (US)

(72) Inventors: Qintao Zhang, Tustin, CA (US); Aimin Xing, Irvine, CA (US)

(73) Assignee: BROADCOM CORPORATION, Irvine, CA (US)

(*) Notice: Subject to any disclaimer, the term of this patent is extended or adjusted under 35 U.S.C. 154(b) by 0 days.

(21) Appl. No.: 14/704,511

(22) Filed: May 5, 2015

(65) Prior Publication Data

US 2016/0300838 A1 Oct. 13, 2016

Related U.S. Application Data

(60) Provisional application No. 62/143,987, filed on Apr. 7, 2015.

(51) Int. Cl.
*H01L 27/092* (2006.01)
*H01L 21/8238* (2006.01)
*H01L 21/84* (2006.01)
*H01L 29/06* (2006.01)
*H01L 29/78* (2006.01)
*H01L 29/167* (2006.01)
*H01L 21/265* (2006.01)

(52) U.S. Cl.
CPC ..... *H01L 27/0922* (2013.01); *H01L 21/26513* (2013.01); *H01L 21/823807* (2013.01); *H01L 21/84* (2013.01); *H01L 29/0649* (2013.01); *H01L 29/167* (2013.01); *H01L 29/7838* (2013.01)

(58) Field of Classification Search
CPC ......... H01L 27/0922; H01L 21/26513; H01L 21/84; H01L 21/823807; H01L 29/167; H01L 29/0649; H01L 29/7838
See application file for complete search history.

(56) References Cited

U.S. PATENT DOCUMENTS

| | | | |
|---|---|---|---|
| 6,872,609 B1 * | 3/2005 | Kamal | H01L 27/11568 257/E21.679 |
| 7,091,069 B2 * | 8/2006 | Doris | H01L 29/66545 257/347 |
| 7,893,502 B2 | 2/2011 | Li et al. | |
| 8,026,554 B2 * | 9/2011 | Manabe | H01L 21/28097 257/369 |

OTHER PUBLICATIONS

Noel et al., Multi-VT UTBB FDSOI Device Architectures for Low-Power CMOS Circuit, IEEE Transactions on Electron Devices, Vol. 58, No. 8, Aug. 2011, 10 pages.

* cited by examiner

*Primary Examiner* — William Coleman
(74) *Attorney, Agent, or Firm* — Foley & Lardner LLP

(57) ABSTRACT

Methods of fabricating devices (e.g., FDSOI devices) having multiple threshold voltages are described. One method includes providing a first fixed charge region proximate to an interface of an insulating (e.g., buried oxide (BOX) layer) and a semiconductor substrate for a first device. The first charge region has a first configuration of fixed charges. The method also includes providing a second fixed charge region proximate to the interface of the insulating layer and the semiconductor substrate for the second device. The second charge region has a second configuration of fixed charges that is different than the first configuration.

20 Claims, 9 Drawing Sheets

DEVICES HAVING MULTIPLE THRESHOLD VOLTAGES AND METHOD OF FABRICATING SUCH DEVICES

CROSS-REFERENCE TO RELATED APPLICATIONS

This application claims the benefit of and priority to U.S. Provisional Application No. 62/143,987, entitled "DEVICES HAVING MULTIPLE THRESHOLD VOLTAGES AND METHOD OF FABRICATING SUCH DEVICES," filed Apr. 7, 2015, which is incorporated by reference herein in its entirety.

FIELD OF THE DISCLOSURE

This disclosure generally relates to devices having multiple threshold voltages or a method of fabricating such devices including fully depleted silicon on insulator (FD-SOI) devices having multiple threshold voltages.

BACKGROUND OF THE DISCLOSURE

An advanced semiconductor chip employs multiple types of field effect transistors (FETs) having different levels of threshold voltage. FETs having a high threshold voltage, also called "low power" devices, have a low on-current and a low off-current. Low power FETs are used, for example, in paths where timing is not critical to reduce power consumption. FETs having a low threshold voltage, also called "high performance" devices, have a high on-current and a high off-current. High performance devices are used, for example, in timing critical paths to achieve high speed. Multiple threshold voltage complementary metal oxide semiconductor (CMOS) technologies employ both high and low threshold voltage transistors within the same integrated circuit (IC).

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
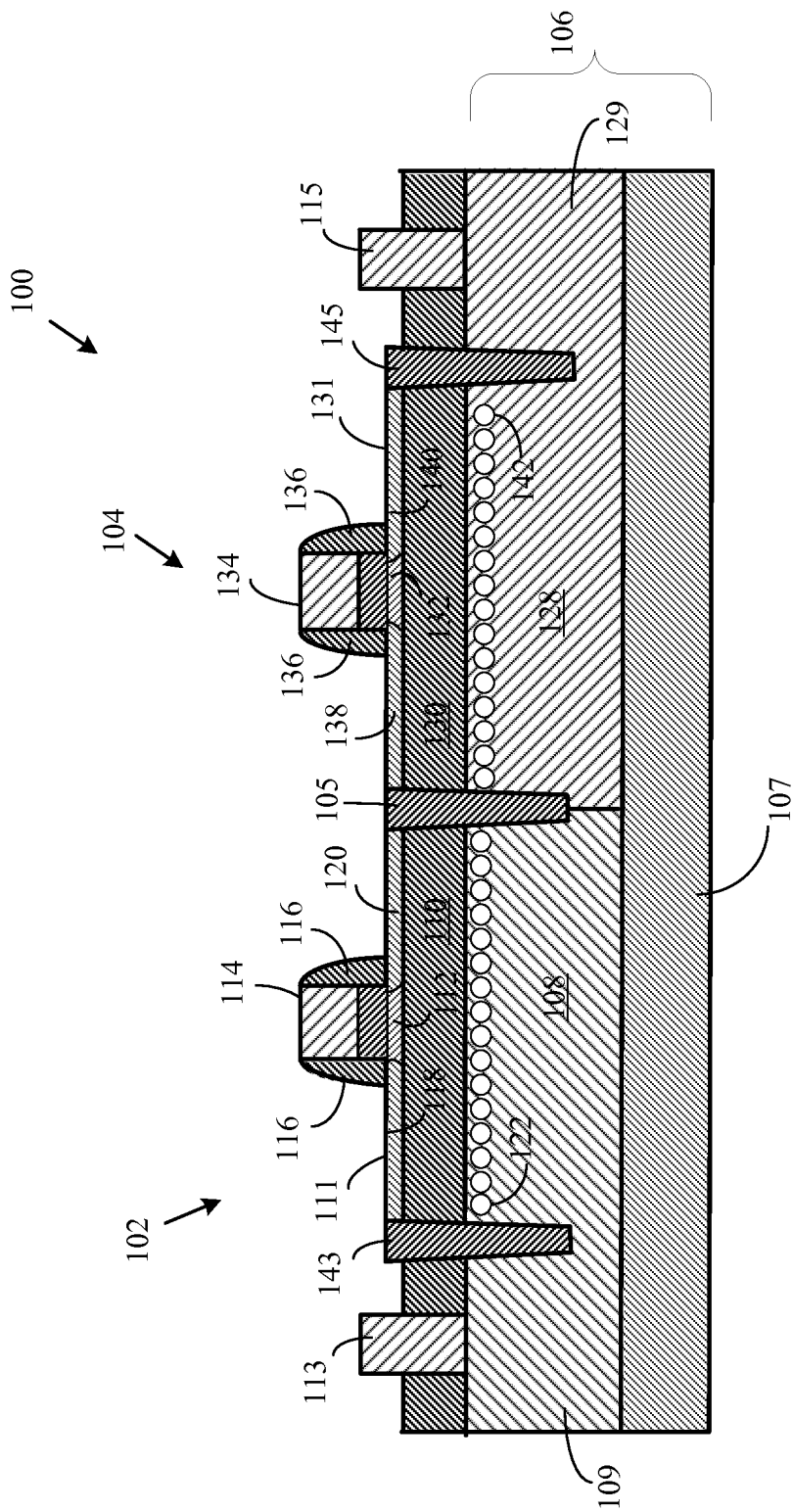
FIG. 1 is a cross sectional view schematic drawing of devices according to some exemplary embodiments.

Before turning to the features, which illustrate some exemplary embodiments in detail, it should be understood that the application is not limited to the details or methodology set forth in the description or illustrated in the figures. It should also be understood that the terminology is for the purpose of description only and should not be regarded as limiting.

Referring generally to the figures, devices having multiple threshold voltages and methods of fabricating such devices are shown according to various exemplary embodiments. Devices having multiple threshold voltages can be fabricated using ion implantation to introduce fixed charges to an interface of an insulating layer (e.g., buried oxide (BOX) layer) and a semiconductor substrate in some embodiments. Negative fixed charges lead to a higher threshold voltage level for a negative type (an N-type) metal oxide semiconductor (NMOS) FET and a lower threshold voltage level for a positive-type (P-type) metal oxide semiconductor (PMOS) FET in some embodiments. Positive fixed charges lead to a lower threshold voltage level for an NMOS FET and a higher threshold voltage level for a PMOS FET in some embodiments. Distinct threshold voltages are achieved depending on different combinations of dopant types in the semiconductor substrate and configurations of the fixed charges in some embodiments. The devices are FDSOI devices in some embodiments.

In some embodiments, a method of fabricating devices on a semiconductor substrate includes providing a first fixed charge region proximate to an interface of an insulating layer (e.g., buried oxide (BOX) layer) and the semiconductor substrate for a first device. The first fixed charge region has a first configuration. The method also includes providing a second fixed charge region proximate to the interface of the insulating layer and the semiconductor substrate for a second device. The second fixed charge region has a second configuration that is different than the first configuration.

In some embodiments, a FDSOI NMOS device having an ultra-high threshold voltage (UHVT) level is fabricated by introducing negative fixed charges to the interface of the insulating layer and a P-type semiconductor substrate or P-type region for the device. In some embodiments, a FDSOI NMOS device having a high threshold voltage (HVT) level is fabricated by introducing negative charges to the interface of the insulating layer and an N-type semiconductor substrate or N-type region for the device. In some embodiments, a FDSOI NMOS device having a low threshold voltage (LVT) level is fabricated by introducing positive charges to the interface of the insulating layer and a P-type semiconductor substrate or P-type region for the device. In some embodiments, a FDSOI NMOS device having an ultra-low threshold voltage (ULVT) level is fabricated by introducing positive charges to the interface of the insulating layer and an N-type semiconductor substrate or N-type region for the device.

In some embodiments, a FDSOI PMOS device having an UHVT level is fabricated by introducing positive fixed charges to the interface of the insulating layer and an N-type semiconductor substrate or N-type region for the device. In some embodiments, a FDSOI PMOS device having a HVT level is fabricated by introducing positive charges to the interface of the insulating layer and an P-type semiconductor substrate or P-type region for the device. In some embodiments, a FDSOI PMOS device having a LVT level is fabricated by introducing negative charges to the interface of the insulating layer and an N-type semiconductor substrate or N-type region for the device. In some embodiments, a FDSOI PMOS device having an ULVT level is fabricated by introducing negative charges to the interface of the insulating layer and a P-type semiconductor substrate or P-type region for the device.

In some embodiments, a silicon on insulator (SOI) device includes a doped semiconductor substrate and a buried insulating layer disposed above the doped semiconductor substrate. The SOI device also includes a silicon film disposed above the buried insulating layer and a region of fixed charges proximate to an interface of the doped semiconductor substrate and the buried insulating layer. In some embodiment, the SOI device is a FDSOI device and the buried insulating layer is a BOX layer. In some embodiments, the fixed charges are negative fixed charges introduced by halogen dopants. In some embodiments, the halogen dopants are fluorine. In some embodiments, the fixed charges are positive fixed charges introduced by nitrogen group dopants. In some embodiments, the nitrogen group dopants are nitrogen.

In some embodiments, a method of fabricating devices on a SOI substrate is provided. The SOI substrate includes a semiconductor substrate, an insulating layer (e.g., a BOX layer) disposed above the semiconductor substrate, and a silicon film disposed above the insulating layer. The method includes implanting first dopants to the semiconductor substrate for a first device and implanting second dopants to a first region proximate to an interface of the insulating layer and the semiconductor substrate for the first device. The method also includes implanting third dopants to the semiconductor substrate for a second device and implanting fourth dopants to a second region proximate to the interface of the insulating layer and the semiconductor substrate for the second device. The first device and the second device are FDSOI devices in some embodiments.

The terms metal oxide semiconductor (MOS) transistor, MOS field effect transistor (FET), and FET refer to any transistor including FETs, metal insulator semiconductor (MIS) transistors, half-transistors, diodes or capacitor structures. The structures described herein using positive-type (P-type) or negative-type (N-type) dopants are not described in a limiting fashion; the concentration of such dopants and types of elements used for doping are not disclosed in a limiting fashion.

With reference to FIG. 1, a structure 100 includes a first device 102 and a second device 104 disposed on a substrate 106 and separated by a shallow trench isolation (STI) structure 105. In some embodiments, structure 100 is a complementary metal oxide semiconductor (CMOS) structure, first device 102 being an N-type FDSOI MOSFET, second device 104 being a P-type FDSOI MOSFET. Alternatively, devices 102 and 104 can be the same-type or similar-types of devices including but not limited to FET-type devices.

STI structure 105 provides physical separation and electrical isolation between first device 102 and second device 104. In some embodiments, STI structure 105 is formed by etching a trench in substrate 106 and filling the trench with high density plasma (HDP) oxide. In some embodiments, the trench is filled with silicon oxide, silicon nitride, or other dielectric material.

Substrate 106 is a silicon substrate, a germanium substrate, a silicon germanium substrate, or other substrate for integrated circuit. Substrate 106 is segmented by STI structures 105, 143, and 145 to a first portion 108 of substrate 106 for first device 102 (e.g., a FDSOI FET) and a second portion 128 of substrate 106 for second device 104 (e.g., a FDSOI FET). In some embodiments, substrate 106 includes a bulk region 107 below a first doped region 109 associated with first portion 108 and a second doped region 129 associated with second portion 128. In some embodiments, first doped region 109 is heavily doped with first-type dopants (e.g., N+), and second doped region 129 is heavily doped with second-type dopants (e.g., P+) opposite to the first type dopants. First doped region 109 is coupled to a contact 113 and second doped region 129 is coupled to a contact 115. In some embodiments, contacts 113 and 115 are provided on a top surface of first doped region 109 and second doped region 129, respectively. In some embodiments, STI structure 143 isolates contact 113 from first device 102; STI structure 145 isolates contact 115 from second device 104.

First device 102 is disposed on a top surface of first portion 108 of substrate 106 and includes an insulating layer 110 (e.g., buried oxide (BOX) layer), a semiconductor layer 111 (e.g., silicon thin film), a gate structure 114, a source 118, a drain 120, and a first fixed charge region 122. In some embodiments, first device 102 is an NMOS device having a threshold voltage that, when applied to gate structure 114, opens a conductive channel 112 between source 118 and drain 120. For voltage levels lower than the threshold voltage, no conductive channel is opened between source 118 and drain 120. Depending on a combination of a type of dopants in first portion 108 and a configuration of fixed charges in first fixed charge region 122, distinct levels of the threshold voltage are achieved. In some embodiments, the distinct levels include an ultra-high threshold voltage (UHVT), a high threshold voltage (HVT), a standard threshold voltage (SVT), a low threshold voltage (LVT), and an ultra-low threshold voltage (ULVT).

In some embodiments, first portion 108, associated with first doped region 109, is heavily doped with either P-type dopants or N-type dopants, depending on the threshold voltage level to be achieved. First device 102 embodied as an NMOS device would have a higher threshold voltage level if first portion 108 is doped with P-type dopants than if first portion 108 is doped with N-type dopants. In some embodiments, the dopant concentration in the first portion 108 is approximately $1 \times 10^{18}/cm^3$ to about $3 \times 10^{19}/cm^3$ (e.g. $5 \times 10^{18}/cm^3$).

Insulating layer 110 is disposed between first portion 108 and semiconductor layer 111. In some embodiments, insulating layer 110 is a BOX layer made from silicon oxide or other suitable oxide material. In some embodiments, BOX layer 110 is approximately 10 nanometers (nm) to 30 nm thick (e.g., 25 nm), also called an "ultra-thin buried oxide."

The transistor channel is provided in semiconductor layer 111 in some embodiments. In some embodiments, semiconductor layer 111 is a silicon thin film having a thickness of approximately 5 nm to 10 nm (e.g., 6 nm). Due to its thinness, the portion of semiconductor layer 111 under gate structure 114 is fully depleted of free carriers when no voltage is applied to gate structure 114 in some embodiments. When a threshold voltage is applied to gate structure 114, a conductive channel 112 is opened between source 118 and drain 120 and an appreciable current flows through the channel in response to a drain bias. In some embodiments, the length of channel 112 is about four (4) times the thickness of semiconductor layer 111.

Gate structure 114 is a stacked structure including at least one gate dielectric layer disposed on channel 112 and at least one gate conductive layer deposited on the at least one gate dielectric layer. In some embodiments, gate structure 114 includes a gate dielectric layer and a high dielectric constant (K) gate dielectric layer. In some embodiments, gate structure 114 includes a stack of conductive layers made from polysilicon, metal, or other conductive materials. In some embodiments, first device 102 includes spacers 106 around gate structure 114 to separate source and drain from gate structure 114. In some embodiments, spacers 106 are made from silicon nitride or other dielectric material by a conformal deposition and etch back process.

Source 118 and drain 120 are heavily doped with N-type dopants in some embodiments where first device 102 is an NMOS device. In some embodiments, source 118/drain 120 is an epitaxial layer deposited on semiconductor layer 111 and forms a raised source/drain structure (not shown in the present figure).

First fixed charge region 122 is located proximate to an interface of first portion 108 and insulating layer 110. In some embodiments, first fixed charge region 122 contains net positive charges. In some embodiments, first fixed charge region 122 contains net negative charges. In some embodiments, the positive charges or negative charges are introduced by dopants at a dose of $10^{11}/cm^2$ to $10^{12}/cm^2$ (e.g., $5 \times 10^{11}/cm^2$). In some embodiments, fixed charges proximate to the interface of first portion 108 and insulating layer 110 shifts the threshold voltage level according to the equation: $\Delta Vt = Q_{fix}/C_{BOX}$, wherein $\Delta Vt$ is the shift of the threshold voltage level, $Q_{fix}$ is the amount of net charges per unit area, and $C_{BOX}$ is the capacitance of the insulating layer per unit area. For first device 102 being an NMOS device in some embodiments, negative fixed charges lead to a higher level of threshold voltage; positive fixed charges lead to a lower level of threshold voltage. As noted above, the type of dopants in first portion 108 also affects the threshold voltage level of first device 102. Thus, a combination of the type of first portion 108 and the configuration of fixed charges in first fixed charge region 122 enables distinct threshold voltage levels.

In some embodiments, fixed charges are introduced to first fixed charge region 122 by ion implantation. In some embodiments, fluorine or other halogen elements are implanted to reach first fixed charge region 122 and form negative charge states proximate to the insulating layer/first portion interface. In some embodiments, nitrogen or other nitrogen group elements are implanted to reach first fixed charge region 122 and form positive charge states proximate to the insulating layer/first portion interface.

Second device 104 has similar structure as first device 102, except that second device 104 is a PMOS device in some embodiments. Second device 104 is disposed on a top surface of second portion 128 of substrate 106 and includes an insulating layer 130 (e.g., buried oxide (BOX) layer), a semiconductor layer 131 (e.g., silicon thin film), a gate structure 134, a source 138, a drain 140, and a second fixed charge region 142. In some embodiments, second device 104 is a PMOS device having a threshold voltage that, when applied to gate structure 134, opens a conductive channel 132 between source 138 and drain 140. Depending on a combination of a type of dopants in second portion 128 and a configuration of fixed charges in second fixed charge region 142, distinct levels of the threshold voltage are achieved. In some embodiments, the distinct levels include an UHVT, a HVT, a SVT, a LVT, and an ULVT.

In some embodiments, second portion 128, associated with second doped region 129, is heavily doped with either P-type dopants or N-type dopants, depending on the threshold voltage level to be achieved. Since a negative voltage is applied to open a conductive channel in a PMOS device, the "level of threshold voltage" or the "threshold voltage level" used herein refers to an absolute value of the threshold voltage. Second device 104 embodied as a PMOS device would have a higher threshold voltage level if second portion 128 is doped with N-type dopants than if second portion 128 is doped with P-type dopants.

Insulating layer 130 is similar to insulating layer 110. Semiconductor layer 131 is similar to semiconductor layer 111. Gate structure 134 and spacers 136 are similar to gate structure 114 and spacers 116, respectively. Source 138 and drain 140 are heavily doped with P-type dopants where second device 104 is a PMOS device according to some embodiments.

Second fixed charge region 142 is similar to first fixed charge region 122 except that the level of threshold voltage is shifted the opposite way by fixed charges. For second device 104 being a PMOS device in some embodiments, negative fixed charges in second fixed charge region 142 lead to a lower level of the threshold voltage; positive fixed charges lead to a higher level of the threshold voltage. As noted above, the level of the threshold voltage refers to the absolute value of the voltage since the threshold voltage of a PMOS device is negative in some embodiments. Thus, a lower level of the threshold voltage means a less negative threshold voltage; a higher level of the threshold voltage means a more negative threshold voltage.

In some embodiments, fewer, more, or different components than those illustrated in FIG. 1 are included and such components are combined in the same or different configurations. All such modifications are contemplated within the scope of the present disclosure.

FIGS. 2-5 illustrate devices, such as FDSOI devices, that have different threshold voltages due to different combinations of dopant types in the substrates and configurations of net charges in fixed charge regions according to some embodiments. MOSFETs having different levels of the threshold voltage perform different operations in an integrated circuit in some embodiments. MOSFETs having a high threshold voltage (i.e., low power) have a low on-current and a low off-current and are used, in some embodiments, in paths where timing is not critical to reduce power consumption. MOSFETs having a low threshold voltage (i.e., high performance) have a high on-current and a high off-current and are used, in some embodiments, in timing critical paths to achieve high speed.

In some embodiments, FDSOI transistors having multiple threshold voltage levels are used in static random access memories (SRAM). In some embodiments, FDSOI transistors having low threshold voltage levels are used to drive bit lines for being able to supply large drain current. In some embodiments, FDSOI transistors having high threshold voltage levels are used to latch data for possessing low leakage current. Utilizing FDSOI as a multiple threshold voltage Vt platform for integrated circuits is compatible with standard CMOS circuit in terms of design and power management. In some embodiments, FDSOI transistors having different threshold voltage levels are fabricated on the same layout.

Figure 2:
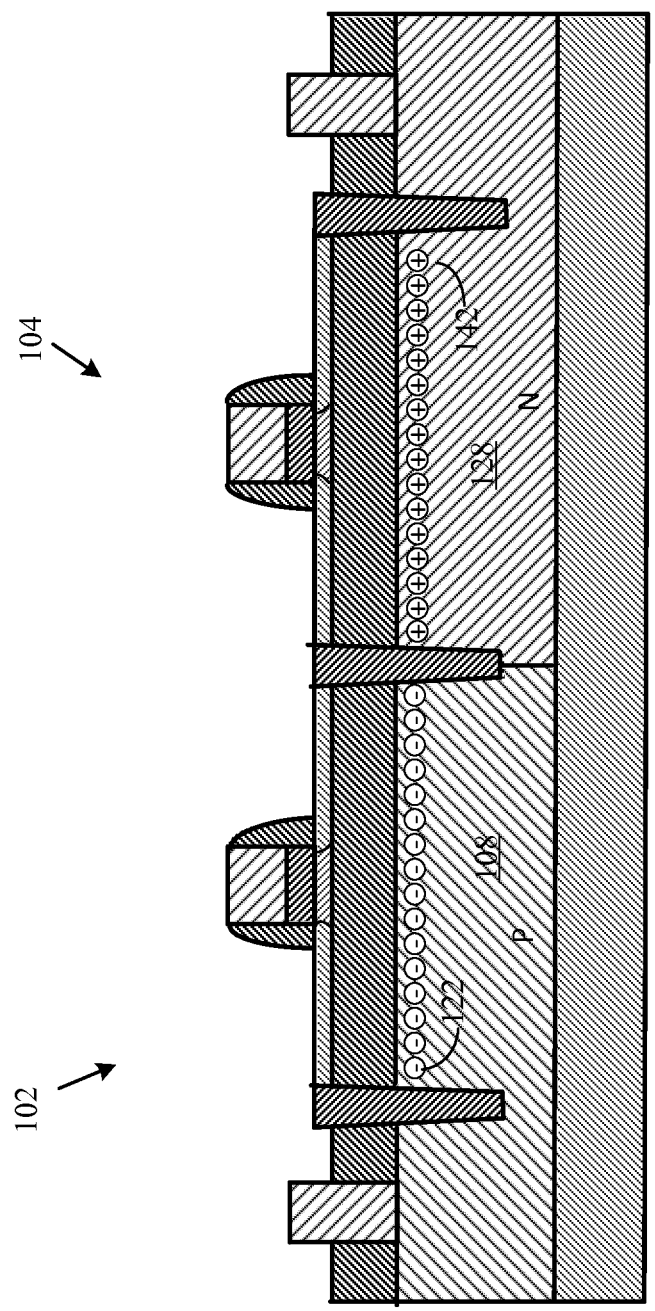
FIG. 2 is a cross sectional view schematic drawing of devices with ultra-high threshold voltages (UHVT) according to some exemplary embodiments.

With reference to FIG. 2, devices having UHTV are shown. First device 102 is an FDSOI NMOS device disposed over a top surface of first portion 108 that is doped with P-type dopants. First fixed charge region 122 contains negative fixed charges in some embodiments. In some embodiments, contacts 113 and 115 are grounded. In some embodiments, drain bias is applied on contacts 113 and 115. Since both the P-type dopants and the negative fixed charges shift the threshold voltage level higher, UHTV is achieved for device 102 embodied as a FDSOI NMOS FET. Second device 104 is embodied as a FDSOI PMOS device disposed over a top surface of second portion 128 that is doped with N-type dopants in some embodiments. Second fixed charge region 142 contains positive fixed charges in some embodiments. Since both the N-type dopants and the positive fixed charges shift the threshold voltage level higher (i.e., more negative), UHTV is achieved for device embodied as a FDSOI PMOS FET 104. UHTV is used herein relative to a standard threshold voltage (SVT) level of FDSOI devices where no fixed charges are introduced. In some embodiments, SVT is 350 millivolts (mV)-500 mV. UHTV is greater than 650 mV. In some embodiments, the threshold voltage level is shifted by the fixed charges according to the equation: $\Delta V t = Q_{fix}/C_{BOX}$, wherein $\Delta V t$ is the shift of the threshold voltage level, $Q_{fix}$ is the amount of net charges per unit area, and $C_{BOX}$ is the capacitance of the insulating layer per unit area. Thus, a particular UHTV level is adjusted by varying the concentration of fixed charges in some embodiments. FDSOI devices having UHTV are used in ultra-low-leakage application, such as Internet of things (IOT), in some embodiments.

Figure 3:
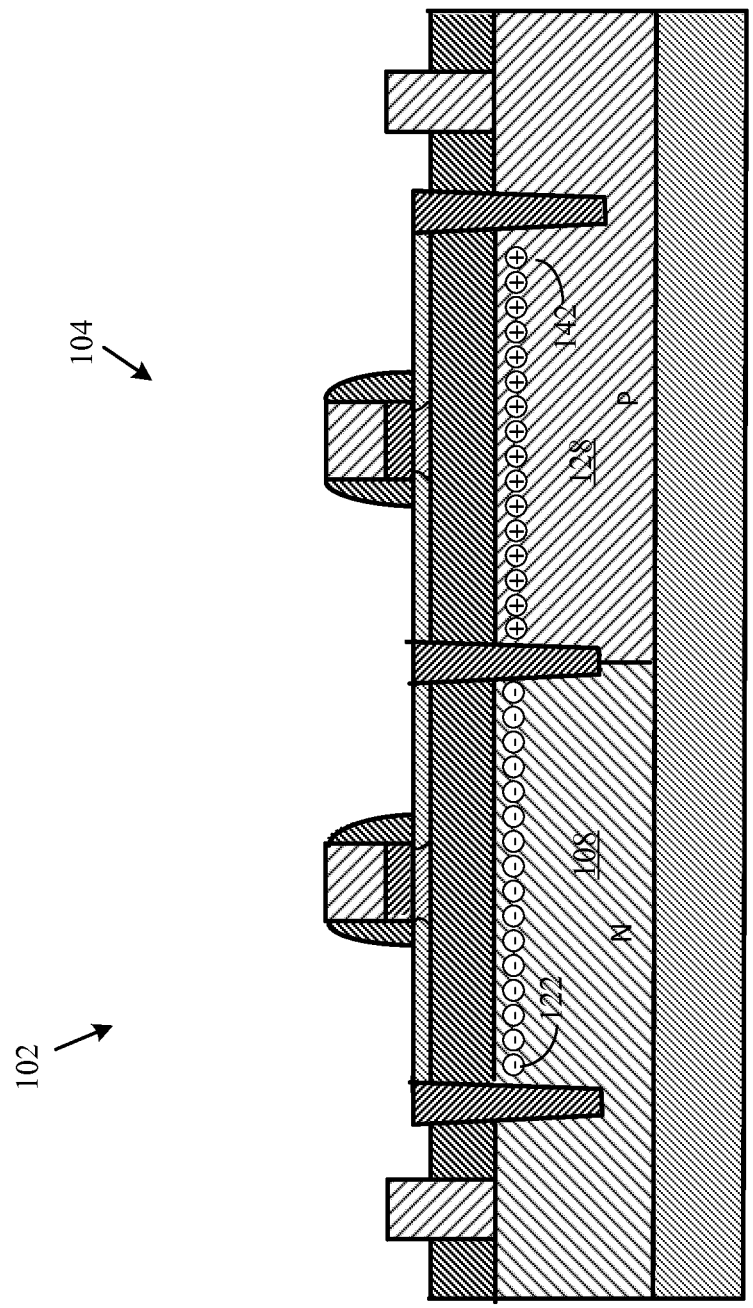
FIG. 3 is a cross sectional view schematic drawing of devices with high threshold voltages (HVT) according to some exemplary embodiments.

With reference to FIG. 3, devices having HTV are shown. First device 102 is a FDSOI NMOS FET where first portion 108 is doped with N-type dopants and first fixed charge region 122 contains negative fixed charges in some embodiments. The N-type dopants shift the threshold voltage level lower, but the negative fixed charges counteract the effect and an overall HTV is achieved on first device 102 in some embodiments. Second device 104 is a FDSOI PMOS FET where second portion 128 is doped with P-type dopants and second fixed charge region 142 contains positive fixed charges in some embodiments. The P-type dopants shift the threshold voltage level lower, but the positive fixed charges counteract the effect and an overall HTV is achieved on second device 104. In some embodiments, HTV is 500 mV-650 mV. A particular HTV level is adjusted by varying the concentration of fixed charges in some embodiments. FDSOI devices having HTV are used to latch data (i.e., as pull-up and pull-down transistors) in SRAM in some embodiments.

Figure 4:
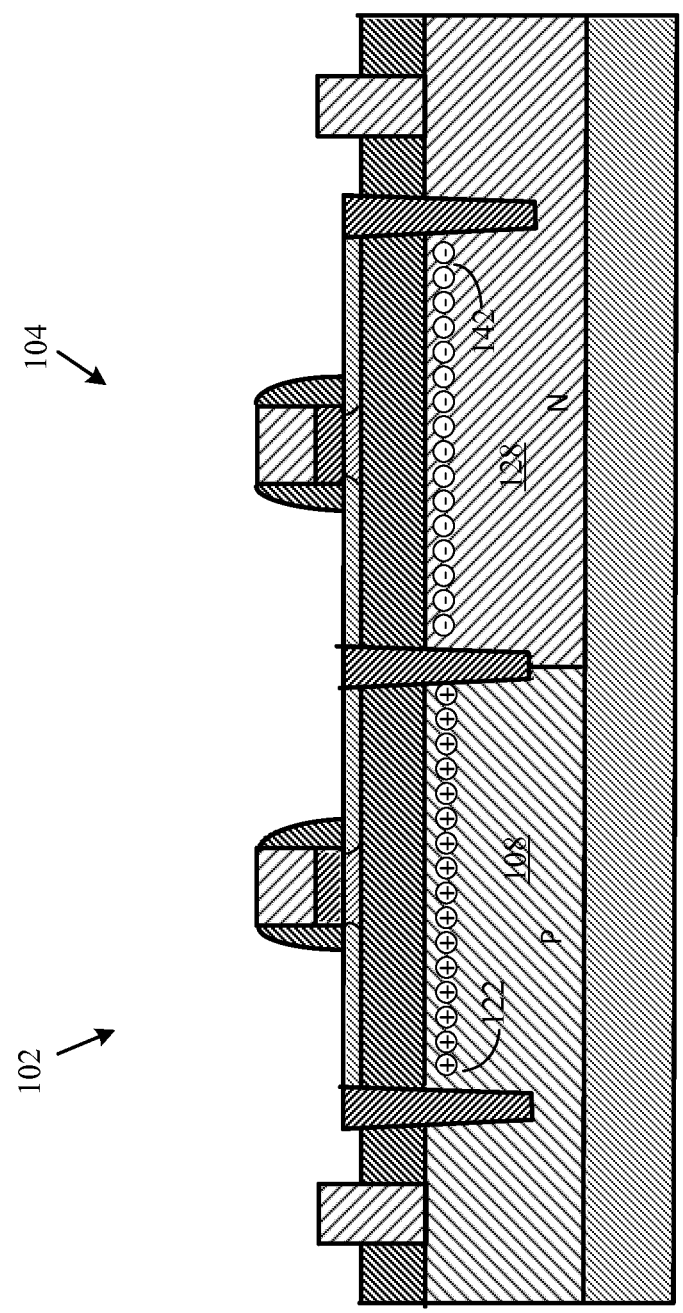
FIG. 4 is a cross sectional view schematic drawing of devices with low threshold voltages (LVT) according to some exemplary embodiments.

With reference to FIG. 4, devices having LTV are shown. First device 102 is a FDSOI NMOS FET where first portion 108 is doped with P-type dopants and first fixed charge region 122 contains positive fixed charges in some embodiments. The P-type dopants shift the threshold voltage level higher, but the positive fixed charges counteract the effect and an overall LTV is achieved for first device 102. Second device 104 is a FDSOI PMOS FET where second portion 128 is doped with N-type dopants and second fixed charge region 142 contains negative fixed charges in some embodiments. The N-type dopants shift the threshold voltage level higher, but the positive fixed charges counteract the effect and an overall LTV is achieved for second device 104 in some embodiments. In some embodiments, LTV is 200 mV-350 mV. A particular LTV level is adjusted by varying the concentration of fixed charges in some embodiments. FDSOI devices having LTV are used to drive bit lines (i.e., as pass gate transistors) in SRAM in some embodiments.

Figure 5:
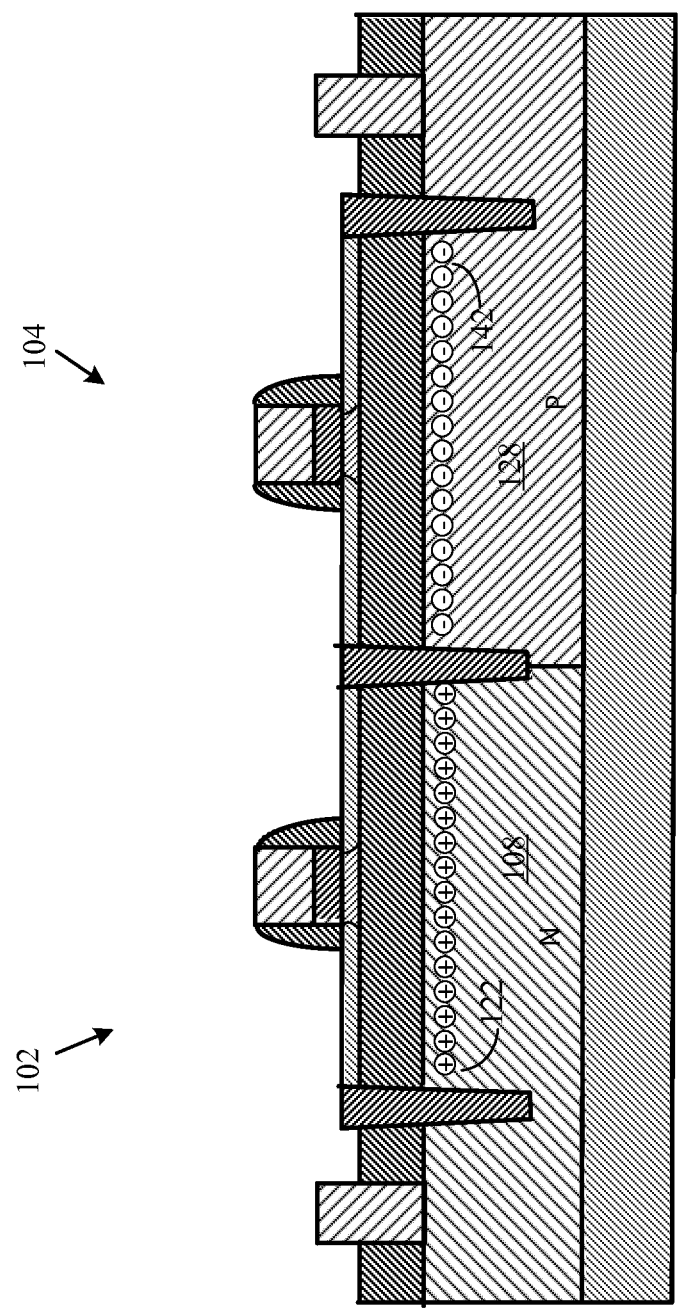
FIG. 5 is a cross sectional view schematic drawing of devices with ultra-low threshold voltages (ULVT) according to some exemplary embodiments.

With reference to FIG. 5, devices having ULTV are shown. First device 102 is a FDSOI NMOS FET where first portion 108 is doped with N-type dopants and first fixed charge region 122 contains positive fixed charges in some embodiments. Since both the N-type dopants and the positive fixed charges shift the threshold voltage level lower, ULTV is achieved for first device 102 in some embodiments. Second device 104 is a FDSOI PMOS FET where second portion 128 is doped with P-type dopants and second fixed charge region 142 contains negative fixed charges in some embodiments. Since both the P-type dopants and the negative fixed charges shift the threshold voltage level lower (i.e., less negative), ULTV is achieved for second device 104 in some embodiments. In some embodiments, ULVT is lower than 200 mV. A particular UHTV level is adjusted by varying the concentration of fixed charges in some embodiments. FDSOI devices having ULTV are used in ultra-high performance applications with ultra-high speed in some embodiments.

Table I summarizes different threshold voltages due to different combinations of dopant types in the substrates and configurations of net charges in fixed charge regions for NMOS and PMOS. TABLE I discloses configurations for some exemplary embodiments and is not disclosed in a limiting fashion.

TABLE I

NMOS/PMOS with different threshold voltages

| | NMOS | | PMOS | |
|---|---|---|---|---|
| | N substrate | P substrate | N substrate | P substrate |
| Negative fix charges (e.g., Fluorine) | HVT | UHVT | LVT | ULVT |
| Positive fix charges (e.g. Nitrogen) | ULVT | LVT | UHVT | HVT |

Figure 6:
FIG. 6 is a flow diagram showing operations for fabricating the devices illustrated in FIG. 1 according to some exemplary embodiments.
Figure 7:
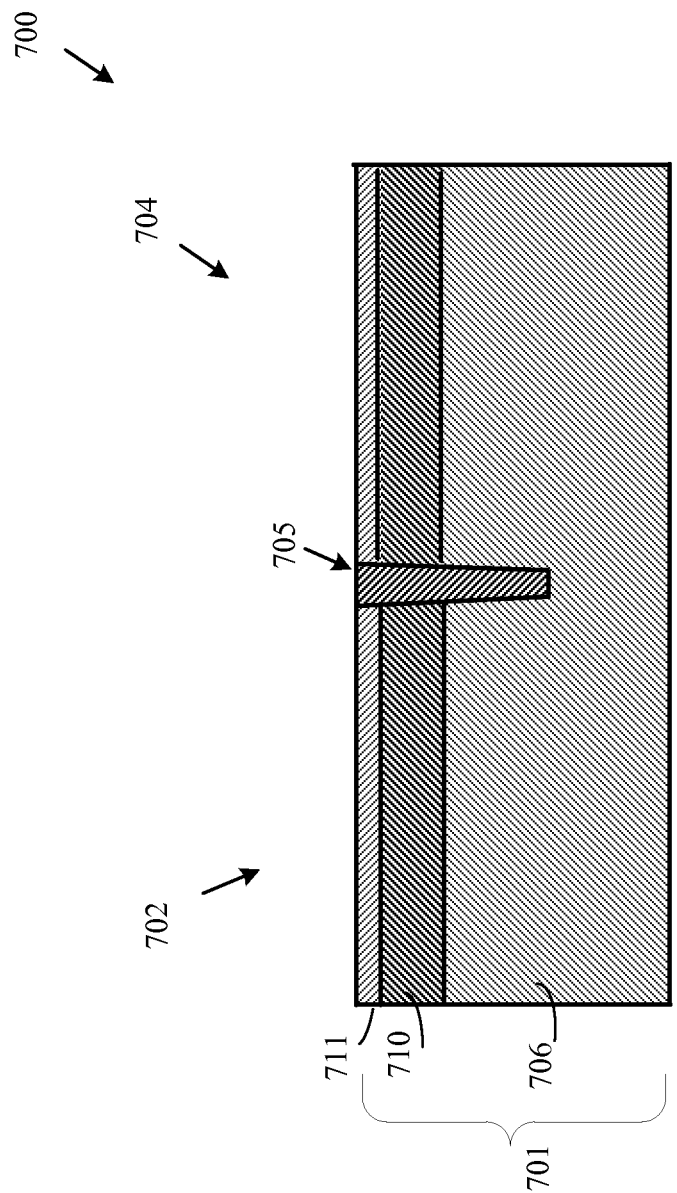
FIG. 7 is a cross sectional view schematic drawing of a silicon on insulator (SOI) substrate with a shallow trench isolation (STI) showing an operation for fabricating the devices illustrated in FIG. 1 according to some exemplary embodiments.

With reference to FIGS. 6-9, fabrication of devices illustrated in FIG. 1 is described below. With reference to FIG. 6, in an operation 602 of flow 600, areas for each device (e.g., FDSOI device) are formed on a silicon on insulator (SOI) substrate. FIG. 7 shows a structure 700 including SOI substrate 701 segmented by STI structure 705 to form areas 702 and 704 for FDSOI devices in some embodiments.

SOI substrate 701 includes semiconductor substrate 706, insulating layer 710 (e.g., BOX layer), and semiconductor layer 711 (e.g., silicon thin film). Substrate 706 is a silicon substrate, a germanium substrate, a silicon germanium substrate, or other substrate for integrated circuit. In some embodiments, insulating layer 710 is a BOX layer made from silicon oxide or other suitable oxide material. In some embodiments, insulating layer 710 is approximately 10 nm to 30 nm thick (e.g., 25 nm). In some embodiments, insulating layer 711 is approximately 5 nm to 10 nm thick (e.g., 6 nm).

STI structure 705 segments SOI structure 701 to first area 702 and second area 704 for devices to be formed. In some embodiments, STI structure 705 is formed in a reactive ion etch (RIE) process followed by an insulating layer deposition process and chemical mechanical polishing processes (CMP). In some embodiments, the material for STI structure 705 include one or more of high density plasma (HDP) oxide, silicon oxide, silicon nitride, silicon oxide nitride, fluoride-doped silicate, and/or a low-K dielectric material.

Figure 8:
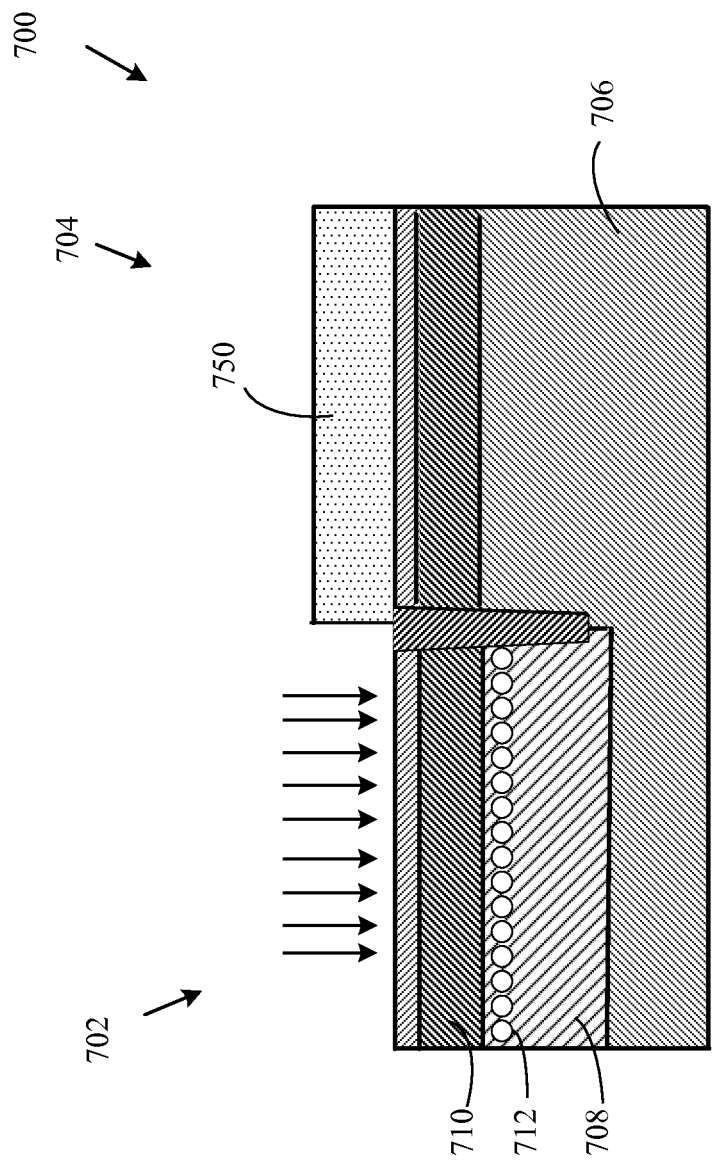
FIG. 8 is a cross sectional view schematic drawing of the substrate illustrated in FIG. 7 showing an operation for fabricating the devices illustrated in FIG. 1 according to some exemplary embodiments.

In an operation 604 (FIG. 6), a first portion of semiconductor substrate 706 for a first device (e.g., FDSOI device) is doped. FIG. 8 shows structure 700 undergoing ion implantations. A first patterned photoresist layer 750 is used as an ion implantation mask covering second area 704 and leaving open first area 702. Either P-type dopants or N-type dopants are implanted into a first portion 708 of semiconductor substrate 706 for the first device, depending on the threshold voltage level to be achieved, as discussed above. In some embodiments, the N-type dopants are phosphorous (P), arsenic (As), or antimony (Sb). In some embodiments, the P-type dopants are boron (B), aluminum (Al), and Gallium (Ga). In some embodiments, the depth of ion implantation reaches the top portion of first area 708 with a dose concentration of $1\times10^{18}/cm^3$ to about $3\times10^{19}/cm^3$ (e.g. $5\times10^{18}/cm^3$). In some embodiments, an anneal treatment is employed to activate the dopants. In some embodiments, silicon thin film is screened with oxide while the substrate is doped.

In an operation 606 (FIG. 6), first fixed charge region 712 is formed for the first device (e.g., FDSOI device) using another ion implantation process. In some embodiments, first patterned photoresist layer 750 is used as the ion implantation mask. In some embodiments, a new mask is used (not shown in the present figure). Either negative fixed charges or positive charges are formed in first fixed charge region 712 proximate to an interface of insulating layer 710 and first portion 708 of semiconductor substrate 706, depending on the threshold voltage level to be achieved, as discussed above. In some embodiments, dopants introducing negative fixed charges are fluorine (F), chlorine (Cl), or other halogen elements. In some embodiments, dopants introducing positive fixed charges are nitrogen (N), or other nitrogen group elements. In some embodiments, the depth of ion implantation reaches first fixed charge region that is proximate to the interface of insulating layer 710 and first portion 708 with a dose concentration of $1\times10^{11}/cm^2$ to about $1\times10^{12}/cm^2$ (e.g. $5\times10^{11}/cm^2$). In some embodiments, an anneal treatment is employed to activate the dopants.

Figure 9:
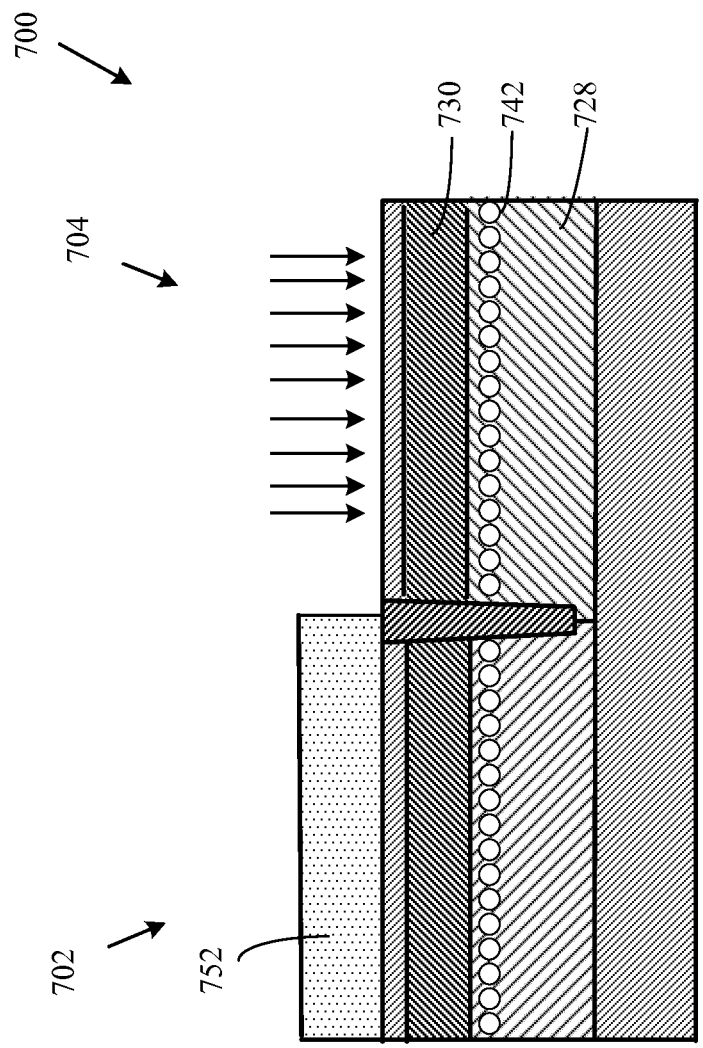
FIG. 9 is a cross sectional view schematic drawing of the substrate illustrated in FIG. 8 showing an operation for fabricating the devices illustrated in FIG. 1 according to some exemplary embodiments.

In an operation 608 (FIG. 6), a second portion 728 of semiconductor substrate 706 for a second device (e.g., FDSOI device) is doped. FIG. 9 shows structure 700 undergoing ion implantations. A second patterned photoresist layer 752 is used as an ion implantation mask covering first area 702 and leaving open first area 704. Either P-type dopants or N-type dopants are implanted into a second portion 728, similar to operation 604.

In an operation 610, second fixed charge region 732 is formed for the second device (e.g., FDSOI device) using another ion implantation. In some embodiments, second patterned photoresist layer 752 is used as the ion implantation mask. In some embodiments, a new mask is used (not shown in the present figure). Either negative fixed charges or positive charges are formed in first fixed charge region 732 proximate to an interface of insulating layer 730 and second portion 728, similar to operation 606.

In some embodiments, flow 600 further includes operations in accordance with 28 nm beyond node FDSOI processes, such as forming gate structure, patterning channel, forming spacers, doping source and drain, making source/drain contacts, making gate contacts, making body bias contacts, etc.

The disclosure is described above with reference to drawings. These drawings illustrate certain details of specific embodiments that implement the systems and methods and programs of the present disclosure. However, describing the disclosure with drawings should not be construed as imposing on the disclosure any limitations that are present in the drawings. The present disclosure contemplates methods, systems and program products on any machine-readable storage media for accomplishing its operations. The embodiments of the present disclosure can be implemented using circuits, such as processing circuits (e.g., an existing computer processor, or by a special purpose computer processor incorporated for this or another purpose). No claim element herein is to be construed as a "means plus function" element unless the element is expressly recited using the phrase "means for." Furthermore, no element, component or method step in the present disclosure is intended to be dedicated to the public, regardless of whether the element, component or method step is explicitly recited in the claims.

It should be noted that certain passages of this disclosure can reference terms such as "first" and "second" in connection with devices for purposes of identifying or differentiating one from another or from others. These terms are not intended to relate entities or operations (e.g., a first region and a second region) temporally or according to a sequence, although in some cases, these entities can include such a relationship. Nor do these terms limit the number of possible entities or operations. Further, the term source/drain region refers to a source region, a drain region, or a region that can be used as a source or a drain.

It should be understood that the circuits described above can provide multiple ones of any or each of those components. In addition, the structures, circuits and methods described above can be adjusted for various system parameters and design criteria, such as shape, depth, thicknesses, etc. Although shown in the drawings with certain components directly coupled to each other, direct coupling is not shown in a limiting fashion and is exemplarily shown. Alternative embodiments include circuits with indirect coupling between the components shown.

It should be noted that although the flowcharts provided herein show a specific order of method steps, it is understood that the order of these steps can differ from what is depicted. Also two or more steps can be performed concurrently or with partial concurrence. Such variation will depend on the software and hardware systems chosen and on designer choice. It is understood that all such variations are within the scope of the disclosure.

While the foregoing written description of the methods and systems enables one of ordinary skill to make and use what is considered presently to be the best-mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A method of fabricating devices on a semiconductor substrate, the method comprising:
providing a first fixed charge region to the semiconductor substrate below an interface between an insulating layer above the semiconductor substrate and the semiconductor substrate for a first device of the devices, the first fixed charge region having a first configuration; and providing a second fixed charge region to the semiconductor substrate below the interface between the insulating layer above the semiconductor substrate and the semiconductor substrate for a second device of the devices, the second fixed charge region having a second configuration, the first configuration being different than the second configuration.

2. The method of claim 1, wherein the devices are FDSOI device, wherein the insulating layer is a buried oxide (BOX) layer, and wherein each of the first configuration and the second configuration comprises an electrical polarity and a concentration of charges.

3. The method of claim 1, wherein the first device has an ultra-high threshold voltage (UHVT) level, the first device being a fully depleted silicon-on-insulator (FDSOI) N-type metal oxide semiconductor (NMOS) device, the semiconductor substrate at a location associated with the first device being P-type, the first fixed charge region comprising negative fixed charges.

4. The method of claim 1, wherein the first device has a high threshold voltage (HVT) level, the first device being a FDSOI NMOS device, the semiconductor substrate at a location associated with the first device being N-type, the first fixed charge region comprising negative fixed charges.

5. The method of claim 1, wherein the first device has a low threshold voltage (LVT) level, the first FDSOI device being a FDSOI NMOS device, the semiconductor substrate at a location associated with the first device being P-type, the first fixed charge region comprising positive fixed charges.

6. The method of claim 1, wherein the first device has a ultra-low threshold voltage (ULVT) level, the first FDSOI device being a FDSOI NMOS device, the semiconductor substrate at a location associated with the first device being N-type, the first fixed charge region comprising positive charges.

7. The method of claim 1, wherein the second device has a ultra-high threshold voltage (UHVT) level, the second device being a FDSOI P-type metal oxide semiconductor (PMOS) device, the semiconductor substrate at a location associated with the second device being N-type, the second fixed charge region comprising positive charges.

8. The method of claim 1, wherein the second device has a high threshold voltage (HVT) level, the second device being a FDSOI PMOS device, the semiconductor substrate at a location associated with the second device being P-type, the second fixed charge region comprising positive charges.

9. The method of claim 1, wherein the second device has a low threshold voltage (LVT) level, the second device being a FDSOI PMOS device, the semiconductor substrate at a location associated with the second device being N-type, the second fixed charge region comprising negative charges.

10. The method of claim 1, wherein the second device has a ultra-low threshold voltage (ULVT) level, the second device being a FDSOI PMOS device, the semiconductor substrate at a location associated with the second device being P-type, the second fixed charge region comprising negative charges.

11. A silicon on insulator (SOI) circuit, the SOI circuit comprising:

a doped semiconductor substrate;
a buried insulating layer disposed above the doped semiconductor substrate;
a silicon film disposed above the buried insulating layer;
a first region comprising first fixed charges disposed in the doped semiconductor substrate proximate to an interface between the doped semiconductor substrate and the buried insulating layer; and
a second region comprising second fixed charges disposed in the doped semiconductor substrate proximate to the interface between the doped semiconductor substrate and the buried insulating layer, the first region having a first configuration, the second region having a second configuration, the first configuration being different than the second configuration.

12. The SOI circuit of claim 11, further comprising a gate disposed above the silicon film, the SOI circuit comprising a device, the device being a fully depleted device, the buried insulating layer being a buried oxide layer.

13. The SOI circuit of claim 11, wherein the fixed charges are negative fixed charges introduced by halogen dopants.

14. The SOI circuit, of claim 11, wherein the fixed charges are positive fixed charges introduced by nitrogen group dopants.

15. The SOI circuit of claim 13, wherein the halogen dopants are fluorine (F).

16. The SOI circuit of claim 14, wherein the nitrogen group dopants are nitrogen (N).

17. A method of fabricating devices on a silicon on an insulator (SOI) substrate, wherein the SOI substrate comprises a semiconductor substrate, an insulating layer disposed above the semiconductor substrate, and a silicon film disposed above the insulating layer, the method comprising:
implanting first dopants to the semiconductor substrate for a first device of the devices;
implanting second dopants to a first region proximate to an interface between the insulating layer and the semiconductor substrate for the first device, wherein the second dopants form a first fixed charge region;
implanting third dopants to the semiconductor substrate for a second device of the devices; and
implanting fourth dopants to a second region proximate to an interface between the insulating layer and the semiconductor substrate for the second device, wherein the fourth dopants form a second fixed charge region.

18. The method of claim 17, wherein the first dopants comprise n-type dopants or p-type dopants, and wherein the third dopants comprises p-type dopants or n-type dopants.

19. The method of claim 18, wherein the second dopants comprise fluorine, wherein the fourth dopants comprise nitrogen, and wherein the devices comprise fully depleted silicon-on-insulator (FDSOI) devices.

20. The method of claim 18, wherein the second dopants comprise nitrogen, wherein the fourth dopants comprise fluorine, and wherein the devices comprise fully depleted silicon-on-insulator (FDSOI) devices.

* * * * *